United States Patent [19]

Tanimoto et al.

[11] Patent Number: 4,677,301
[45] Date of Patent: Jun. 30, 1987

[54] ALIGNMENT APPARATUS

[75] Inventors: Akikazu Tanimoto, Yokohama; Toshio Matsuura, Koshigaya; Seiro Murakami; Makoto Uehara, both of Tokyo; Kyoichi Suwa, Yokohama, all of Japan

[73] Assignee: Nippon Kogaku K. K., Tokyo, Japan

[21] Appl. No.: 681,843

[22] Filed: Dec. 14, 1984

[30] Foreign Application Priority Data

Dec. 19, 1983 [JP] Japan ................................ 58-239100

[51] Int. Cl.⁴ .......................... G01N 21/86; H01J 3/14
[52] U.S. Cl. ..................................... 250/548; 250/234
[58] Field of Search ............... 250/548, 202, 203, 234; 356/399, 400

[56] References Cited

U.S. PATENT DOCUMENTS 4,311,389 1/1982 Fay et al. ............................ 356/400

Primary Examiner—Gene Wan
Attorney, Agent, or Firm—Shapiro and Shapiro

[57] ABSTRACT

A position alignment apparatus aligns a photosensitive substrate and a mask (projection image) at high speed and with high precision. The apparatus has a projection optical system for projecting a pattern image on a mask or reticle onto a photosensitive substrate, a detector for detecting a two-dimensional misalignment of a projected pattern image and a wafer, and means for moving the wafer along orthogonal x- and y-axis directions and for rotating the wafer along a rotational direction within a plane defined by the x- and y-axis directions so as to eliminate the misalignment, wherein the detector has first detecting means with an optical system for detecting at least a misalignment of the wafer along the x-axis direction through the projection lens, and second detecting means with an optical system separate from the projection lens and for detecting at least a misalignment of the wafer along a rotational direction.

18 Claims, 23 Drawing Figures

F I G. 1
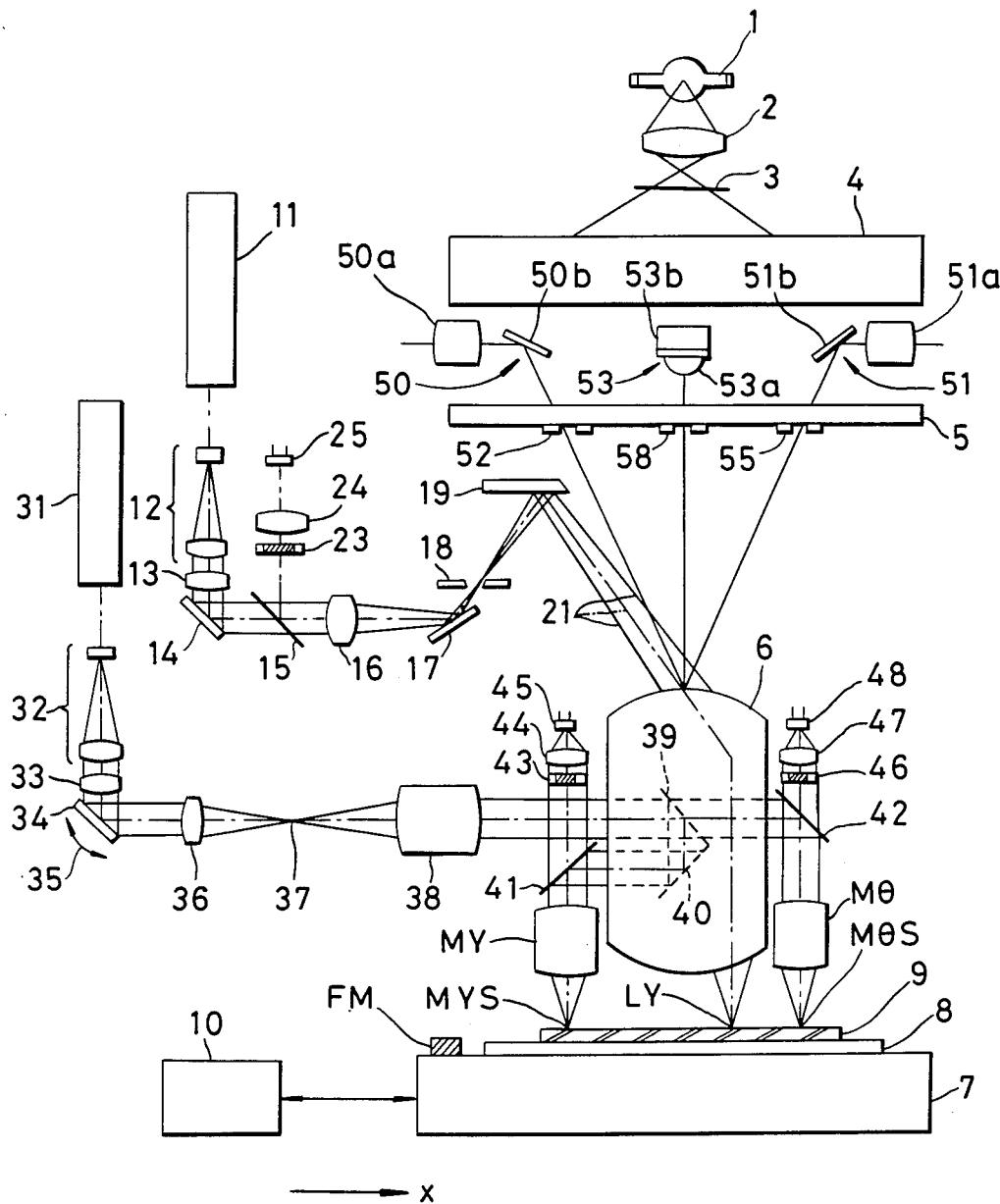

ALIGNMENT APPARATUS

BACKGROUND OF THE INVENTION

1. Field of the Invention

The present invention relates to an alignment apparatus for correctly aligning a mask or reticle with a photosensitive substrate (wafer) in a projection exposure apparatus for optically transferring a pattern of an integrated circuit (IC) or the like.

2. Description of the Prior Art

Large Scale Integrated (LSI) circuit patterns are currently being further micronized. In order to meet demand for further micronization, a reducing projection exposure apparatus is used as a circuit pattern printing apparatus having high productivity. In a conventional apparatus of this type, a reticle pattern having a size several times (e.g., 5 times) that of a pattern to be printed on a silicon wafer is projected in a reduced size through a projection lens. An area of a wafer which can be printed from a single exposure operation is smaller than a square having a diagonal of 21 mm. For this reason, in order to print a pattern on the entire surface of a wafer having a diameter of about 125 mm, the so-called step-and-repeat method is adopted wherein a wafer is placed on s stage and is exposed upon each unit displacement.

In the manufacture of LSIs, more than one pattern layers are sequentially formed on a wafer. However, unless pattern misalignment (positional error) between different pattern layers is kept below a predetermined value, desired conductivity or insulation properties between the respective layers cannot be obtained, and the obtained LSI will not function normally. Misalignment of at most about 0.2 $\mu$m is allowed for a minimum line width of 1 $\mu$m.

In a reducing projection exposure apparatus, the off-axis system and the through-the-lens (TTL) system are known for aligning a pattern already formed on a wafer and a projection image of a reticle. In the off-axis system, the position of a wafer alignment mark is detected by an alignment microscope arranged outwardly of a projection lens, and the wafer is aligned with a reticle in one step. Therefore, the off-axis system allows fast alignment and high-precision rotational position alignment. However, if the wafer expands or contracts at least partially, a high alignment precision over the entire surface of the wafer cannot be obtained.

Meanwhile, in the TTL system, an alignment mark on a wafer can be detected for each small area which is exposed by projection through a projection lens. Therefore, a good alignment precision can be obtained over the entire surface of the wafer. However, with this system, alignment speed is slow and a rotational alignment error is hard to eliminate.

SUMMARY OF THE INVENTION

It is an object of the present invention to provide a position alignment apparatus of simple construction which aligns a photosensitive substrate and a mask (projection image) at high speed and with high precision.

In order to achieve the above object, there is provided an apparatus having a projection optical system for projecting a pattern image on a mask or reticle onto a photosensitive substrate, a detector for detecting a two-dimensional misalignment of a projected pattern image and a wafer, and means for moving the wafer along orthogonal x- and y-axis directions and for rotating the wafer along a rotational direction within a plane defined by the x- and y-axis directions so as to eliminate the misalignment, wherein the detector has first detecting means with an optical system for detecting at least a misalignment of the wafer along the x-axis direction through the projection lens, and second detecting means with an optical system separate from the projection lens and for detecting at least a misalignment of the wafer along a rotational direction.

BRIEF DESCRIPTION OF THE DRAWINGS

FIG. 1 is a diagram showing a schematic arrangement of a reducing projection exposure apparatus to which the present invention can be applied;

DESCRIPTION OF PREFERRED EMBODIMENTS

Figure 2:
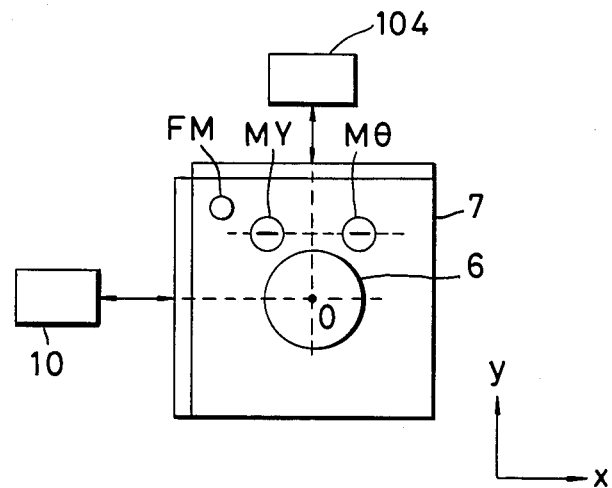
FIG. 2 is a plan view showing the arrangement of a reducing projection lens and an off-axis type wafer alignment microscope.

The construction of a projection exposure apparatus to which the present invention can be applied will be described with reference to FIGS. 1, 2, and 3.

A light source 1 emits light having a wavelength (exposure wavelength) to which a sensitizer is sensitive. The light from the light source 1 is guided through a shutter 3 via a first condenser lens 2 and reaches a second condenser lens 4. The shutter 3 controls transmission/shielding of the light, and the second condenser lens 4 uniformly illuminates a reticle (mask) 5. A reducing projection lens (to be referred to be as a projection lens hereinafter) 6 reduces the size of an image of a pattern formed on the reticle 5 to 1/5 or 1/10 the original size, and projects the reduced image onto a wafer (photosensitive substrate) 9 on which a sensitizer is coated. A wafer holder 8 holds a wafer 9 placed thereon by suction, and is placed on an x-y stage (to be referred to as a stage hereinafter) 7 so as to be rotatable and vertically movable. A reference mark place FM is also placed on the stage 7 and is vertically moved upon vertical movement of the wafer holder 8. The x-coordinate of the stage 7 is detected by a laser interferometer 10 which utilizes the principle of interference of laser beams. The y-coordinate of the stage 7 is detected by a similar laser interferometer 104, as shown in FIG. 2. The laser beams from the interferometers 10 and 104 are perpendicular to each other, and their intersection point coincides with an optical axis 0 of the projection lens 6.

Referring to FIG. 1, a laser 11 emits a laser beam of a wavelength to which the sensitizer on the wafer 9 is not sensitive. The laser beam is passed through a beam expander 12 and a cylindrical lens 13, reflected by a reflecting plate 14, passed through a beam splitter 15, and focused by a focusing lens 16. The focused beam is redirected by a reflecting mirror 17 toward the rear surface of the reticle 5 (the surface facing the projection lens 6). A stop 18 is arranged at the beam waist of the laser beam, and the laser beam passed through an aperture of the stop 18 diverges and becomes incident on a reflecting mirror 19. The laser beam forms a linearly converged image at the center of the stop 18. The reflecting mirror 19 has a reflecting surface which is parallel to the rear surface of the reticle 5 (to be referred to as the pattern surface) and which reflects the incident laser beam toward the pupil of the projection lens 6.

Laser beams 21 reflected by the reflecting mirror 19 are focused by the projection lens 6 and form a spot LY on the wafer 9. The spot LY has a linearly converged shape elongated along the x-axis direction (by means of the cylindrical lens 13) and is used for detecting the y-coordinate of a mark which is elongated on the wafer 9 along the y-axis direction. A diverging or diffracted laser beam reflected by the mark on the wafer becomes incident on the other side of the projection lens 6 and is reflected by the beam splitter 15 through the reflecting mirror 19, the stop 18, the reflecting mirror 17, and the focusing lens 16. The light beam then reaches a spatial filter 23. The spatial filter 23 shields the light beam normally reflected by the wafer but transmits the diverging or diffracted light beam. A focusing lens 24 focuses the diverging or diffracted light beam from the mark received through the spatial filter 23 onto the light-receiving surface of a photosensor 25. The main laser beam among laser beams 21 for forming the spot LY is inclined with respect to the optical axis of the projection lens 6 between the reticle 5 and the projection lens 6, as shown in FIG. 1.

The inclination is due to a telecentric optical relationship of the reticle 5 of the projection lens 6. The reflecting mirror 19 for reflecting the laser beams 21 toward the pupil of the projection lens 6 is arranged at a position so that the light of the exposure wavelength from the reticle 5 will not be shielded during pattern projection from the reticle.

The beam splitter 15, the focusing lens 16, the stop 18, the spatial filter 23, the focusing lens 24, and the photosensor 25 together constitute a Y alignment detection system of TTL type. Although not shown in FIG. 1, an X alignment detection system of TTL type is similarly incorporated in a direction perpendicular to the sheet of drawing so as to form on the wafer a spot LX which is elongated along the y-axis direction.

In order to perform wafer alignment (positioning), a wafer alignment detection system of off-axis type is also incorporated in addition to the alignment detection systems of TTL type. A laser 31 emits a laser beam having a wavelength to which a sensitizer on a wafer is not sensitive. The laser beam emitted by the laser 31 is formed into a parallel beam by a beam expander 32. The parallel laser beam is passed through a cylindrical lens 33 and is reflected by a vibrating mirror 35 such as a mirror galvanometer. The laser beam then becomes incident on a focusing lens 36 to form a spot at a focal point 37. An oscillation mirror 35 is capable of rotary oscillation at a constant angular frequency through a small angle. Thus, the laser beam focused at the focal point 37 is subjected to simple harmonic motion in a direction perpendicular to the sheet of drawing. The laser beam from the focusing lens 36 is reconverted into a parallel laser beam by a second objective lens 38 and is divided into two beams by a beam splitter 39. The reflected beam from the beam splitter 39 is reflected again by a reflecting mirror 40 and becomes incident on a beam splitter 41. A beam reflected by the beam splitter 41 is incident on a first objective lens MY. The cylindrical lens 33, the first objective lens MY and the second objective lens 38 together serve to form a linearly converged spot MYS on the wafer elongated along the x-axis direction. Meanwhile, the laser beam transmitted through the beam splitter 39 is reflected by a beam splitter 42 and is incident on a first objective lens MΘ. Thus, a linearly converged spot MΘS elongated along the x-axis direction is formed on the wafer. The optical axes of the first objective lenses MY and MΘ are parallel to that of the projection lens 6, and the interval therebetween is determined to be a predetermined value smaller than the diameter of the circular wafer. The direction of a line segment on the wafer which connects the optical axes of the first objective lenses MY and MΘ coincides with the x-axis direction. The spots MYS and MΘS are finely oscillated on the wafer along the y-axis direction by the oscillation mirror 35 and illuminate a mark which is formed on the wafer and elongated along the x-axis direction. When the spot MYS irradiates the mark, a diverging or diffracted beam becomes incident on the first objective lens MY, transmitted through the beam splitter 41, and reaches a spatial filter 43. The spatial filter 43 shields the beam of the spot MYS normally reflected by the wafer and transmits a diverging or diffracted beam from the mark. The diverging or diffracted beam is focused onto the light-receiving surface of a photosensor 45 by a focusing lens 44. Similarly, when the spot MΘS irradiates the mark, the diverging or diffracted beam from the mark on the wafer is incident on the first objective lens MΘ, transmitted through the beam splitter 42 and reaches a spatial filter 46. The spatial filter 46 has the same function as that of the spatial filter 43. Thus, the diverging or diffracted beam passed through the spatial filter 46 is focused onto the light-receiving surface of a photosensor 48 by a focusing lens 47. The photosensors 45 and 48 produce photoelectric signals corresponding to the intensity of the diverging or diffracted beam from the mark on the wafer. The beam splitter 39 and the reflecting mirror 40 are arranged behind the projection lens 6, as shown in FIG. 1, and the first objective lenses MY and MΘ are also arranged behind the projection lens 6, as shown in FIG. 2. The first objective lens MY, the beam splitter 41, the spatial filter 43, the focusing lens 44, and the photosensor 45 together constitute a Y alignment system. The first objective lens MΘ, the beam splitter 42, the spatial filter 46, the focusing lens 47, and the photosensor 48 constitutes a Θ alignment system.

Three other alignment optical systems are included for reticle alignment. Reticle alignment marks 52, 55 and 58 are formed at positions around the reticle so that they are projected around a projection region of the pattern during projection exposure. A reticle alignment optical system 50 consists of a microscopic objective lens 50a and a reflecting mirror 50b and detects the reticle alignment mark 52 through a gap between the reticle 5 and the second condenser lens 4. The mark 52 is formed for reticle alignment along the y-axis direction. The reticle alignment optical system 50 has a predetermined reference position (detection center) and detects a misalignment or deviation of the mark 52 with respect to the reference position along the y-axis direction. A reticle alignment optical system 51 consists of a microscopic objective lens 51a and a reflecting mirror 51b and detects the reticle alignment mark 55. The mark 55 is used for reticle alignment along the y-axis direction. The reticle alignment optical system 51 detects a deviation of the mark 55 with respect to a reference position (detection center) along the y-axis direction. A reticle alignment optical system 53 consists of a microscopic objective lens 53a and a reflecting mirror 53b and detects the reticle alignment mark 58. The mark 58 is used for reticle alignment along the x-axis direction. The reticle alignment optical system 53 detects a deviation of the mark 58 from a reference position (detection center) along the x-axis direction. The reticle alignment systems 50, 51 and 53 respectively have illumination optical systems which coaxially illuminate the reticle 5 with light of the exposure wavelength through the microscopic objective lenses 50a, 51a and 53a and the reflecting mirrors 50b, 51b and 53b. In addition to the reticle alignment marks 52, 55 and 58, the reticle alignment optical systems 50, 51 and 53 detect a mark formed on the reference mark plate FM through the projection lens.

Figure 3:
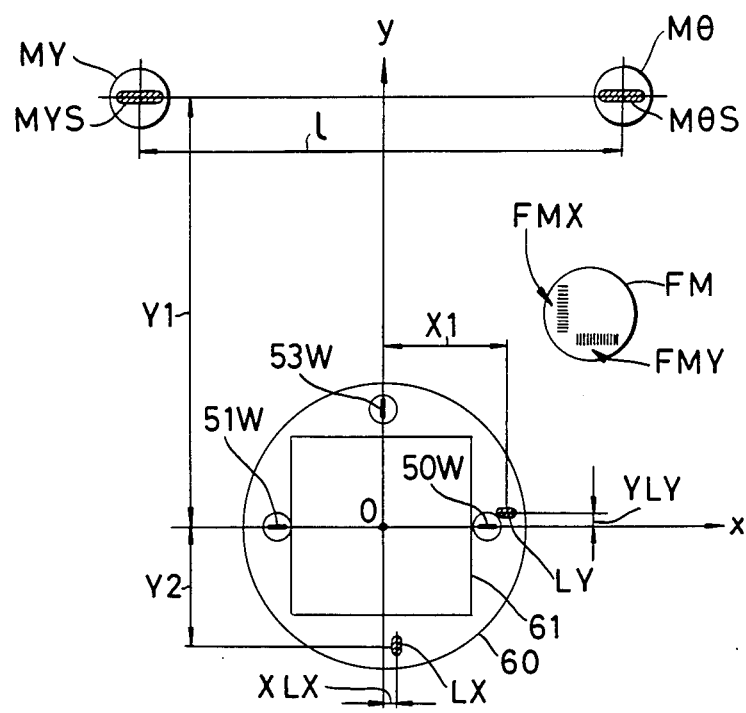
FIG. 3 is a plan view showing beam spots of a detection system.

FIG. 3 is a plan view, in a plane including the surface of the wafer, showing the spot LY and a spot LX formed by the alignment detection system of TTL type, the spots MYS and MΘS formed by the Y and Θ alignment detection system, and the projection positions at the detection centers of the reticle alignment optical systems 50, 51 and 53. An origin O (exposure center) of the x-y coordinate system is plotted on the optical axis of the projection lens 6. Then, the stage 7 is moved along the x- and y-axis directions of the x-y coordinate system. A circular region 60 represents a maximum exposure region which can be projected by the projection lens. A rectangular region 61 inside the region 60 represents a rectangular pattern exposure region of the reticle, which is exposed onto the wafer. Projection images 50W and 51W of the detection centers of the reticle alignment optical systems 50 and 51 have predetermined minute lengths along the x-axis direction and are projected together along the x-axis. A projection image 53W of the detection center of the reticle alignment optical system 53 has a predetermined minute length and is projected along the y-axis. The images 50W, 51W and 53W are defined outside the pattern exposure region 61 and inside the effective exposure region 60.

The spot LY formed by the TTL system is also formed outside the pattern exposure region 61 and inside the effective exposure region 60, and is located radially with respect to the origin O. The distance between the longitudinal (x-axis direction) center of the spot LY and the y-axis is defined to be $X_1$, while the distance between the longitudinal (y-axis direction) center of the spot LX and the x-axis is defined to be $Y_2$.

The central position of the spot LY along the y-axis direction preferably coincides with the x-axis. However, it suffices if a distance YLY along the y-axis direction with respect to the x-axis is correctly detected in advance. The central position of the spot LX also preferably coincides with the y-axis. However, it suffices if a distance XLX along the x-axis direction with respect to the y-axis direction is correctly detected in advance.

The spots MYS and MΘS are formed at positions the distance $Y_1$ from the x-axis by the first objective lens MY of the Y alignment detection system and the first objective lens MΘ of the Θ alignment detection system, respectively. An interval between the longitudinal (x-axis direction) center of the spot MYS and the longitudinal center (x-direction) of the spot MΘS is determined to be l. In this embodiment, it is assumed that the centers of the spots MYS and MΘS along the x-axis direction are at equal distance from the y-axis; they are symmetrical with respect to the y-axis. The reference mark plate FM on the stage 7 is obtained by forming a predetermined pattern (mark) of chromium on a glass base.

A reference mark FMX consisting of a periodic array of short line segments aligned along the y-axis direction and a reference mark FMY consisting of a periodic array of short line segments aligned along the x-axis direction are formed on the reference mark plate FM. When the reference mark FMY is irradiated with the spot MYS, MΘS or LY, diffracted light is produced depending upon the pitch of the segments or the wavelength of the laser beam. When the reference mark FMX is irradiated with the spot LX, diffracted light is similarly produced. Although the spots MYS and MΘS are finely oscillated in the y-axis direction, the magnitude of their movement is determined to be about the same as the spot size.

The wafer alignment systems (Y and Θ alignment optical systems) of off-axis type detect the positional error of the wafer with respect to the reference position along the y-axis direction and the rotational error of the wafer. The wafer alignment systems of TTL (on axis system) detect deviations of the exposure region on the wafer from the spots LX and LY along the x- and y-axis directions corresponding to a predetermined reference position on the apparatus, i.e., the pattern exposure region 61 or the effective exposure region 60 Thus, the alignment systems of TTL type will be referred to as Laser Step Alignment detection systems LSA. One type which uses the spot LX will be referred to as an alignment system X-LSA, and another which uses the spot LY will be referred to as an alignment system Y-LSA.

In the system X-LSA or Y-LSA, a laser beam of a wavelength to which the sensitizer is not sensitive and different from the exposure wavelength is passed through the projection lens. In a projection lens of this type, a correction for chromatic aberration for light of the exposure wavelength is performed. When light of a wavelength different from the exposure wavelength is used, the conjugate relationship between a wafer surface and a reticle pattern surface obtained by projection of a pattern image of the reticle onto the wafer with such light is significantly disturbed. Therefore, in this embodiment, the optical length of the laser at the side of the reticle is adjusted by the reflecting mirrors 17 and 19 so that the spots LX and LY are formed in a plane identical to the imaging plane of the projection lens which is obtained when the reticle is irradiated with light of the exposure wavelength from the light source 1.

The imaging planes of the spots LX, LY, MYS and MΘS are set to be within a plane which is identical to the imaging plane of the pattern image of the reticle when the reticle 5 is irradiated with light of exposure wavelength.

Figure 4:
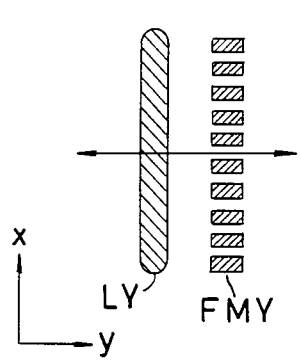
FIG. 4 is a plan view showing a beam spot and a reference mark.
Figure 5:
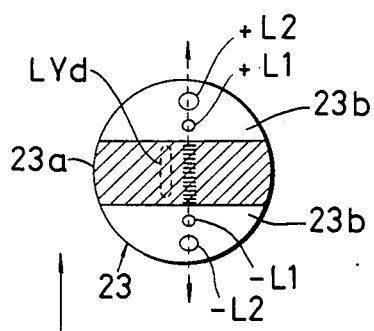
FIG. 5 is a plan view showing the structure of a spatial filter.

FIG. 4 shows the relationship between the spot LY and the reference mark FMY, and FIG. 5 is a plan view showing the shape of the spatial filter 23 of the detection system Y-LSA. Referring to FIG. 4, when the stage 7 is moved along the y-axis direction and the reference mark FMY scans the spot LY, a light beam is normally reflected by the reference mark FMY (0-th order diffracted light) and diffracted light of 1-st order, 2-nd order and the like is similarly produced from the reference mark FMY in the direction of array of the segments of the mark FMY. As shown in FIG. 5, the circular spatial filter 23 has a band-like light-shielding portion 23a at its center, and light-transmitting portions 23b sandwiching the portion 23a.

The light-shielding portion 23a shields a reflected beam LYd of the spot LY normally reflected by the reference mark plate FM or the wafer. Of diffracted light beams produced from the reference mark FMY, the transmitting portions 23b transmit diffracted light beams ±L1 and ±L2 of 1st and 2-nd order. In this embodiment, a spatial filter for the detection system X-LSA and the spatial filters 43 and 46 for the Y and Θ alignment detection systems have a similar arrangement. Diffraction marks similar to the reference marks FMY and FMX are formed on the wafer. When these marks on the wafer are irradiated with the spots LY, LX, MYS, and MΘS, diffracted light is similarly produced.

Figure 6:
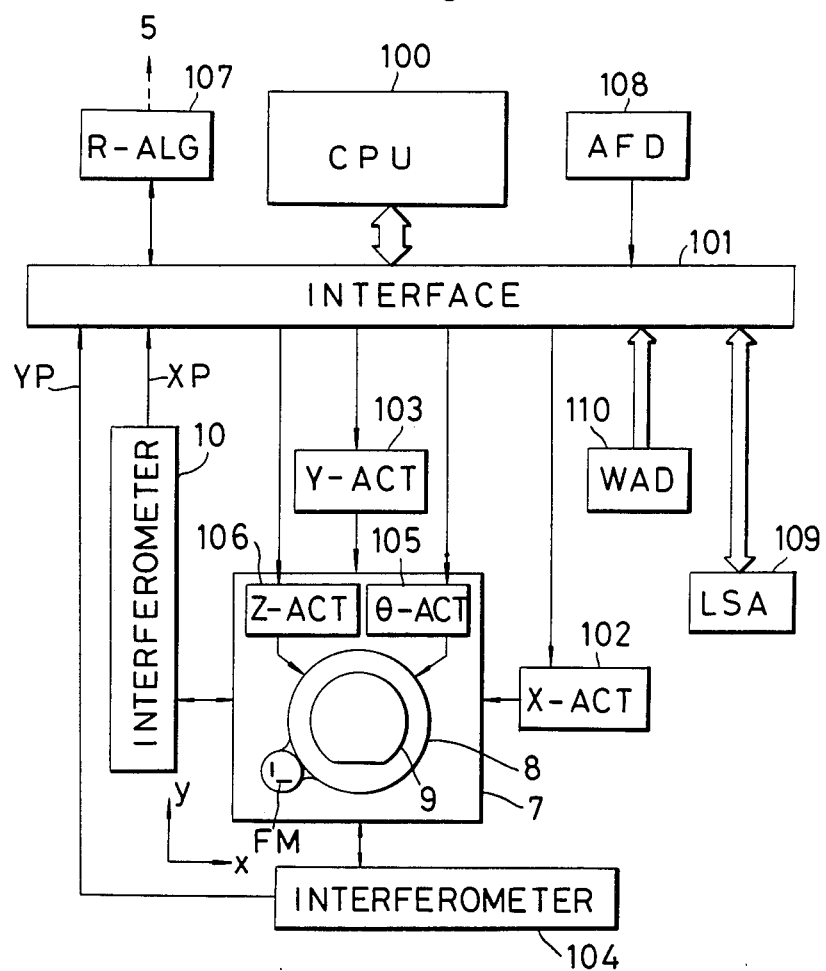
FIG. 6 is a block diagram of a control system for controlling the overall exposure apparatus.

FIG. 6 is a block diagram showing a control system for controlling the overall apparatus. The overall operation or sequence is controlled by a microcomputer (to be referred to as a CPU hereinafter) 100. Data from the CPU 100 is supplied to various pieces of peripheral equipment (peripheral circuits) through an interface 101. Detection data from these peripheral circuits and the like are fetched in the CPU 100 through the interface 101. The stage 7 is two-dimensionally moved by an x-actuator (to be referred to as X-ACT) 102 comprising a motor and the like, and a y-actuator (to be referred to as Y-ACT) 103. The amount of movement of the stage 7 is instructed by the CPU 100. The position of the stage 7 is detected as x- and y-coordinates by the laser interferometers 10 and 104. The laser interferometers 10 and 104 produce pulse signals $X_p$ and $Y_p$ per unit moving distance of the stage 7 along the x- and y-axis directions, for example, per moving distance of 0.02 $\mu$m along the respective directions. The pulse signals $X_p$ and $Y_p$ are counted up or down by digital counters inside the interface 101. The counts of these counters are fetched in the CPU 100 so as to detect the x- and y-coordinates (two-dimensional position) of the stage 7. The wafer holder 8 on the stage 7 is rotated relative to the stage 7 by a rotary actuator (to be referred to as Θ-ACT hereinafter) 105, and is also moved by a vertical actuator (to be referred to as Z-ACT hereinafter) 106 in a direction (vertical direction) perpendicular to the plane of movement of the stage 7 along the x- and y-axis directions. The reference mark plate FM is vertically moved together with the wafer holder 8. A reticle alignment system (to be referred to as R-ALG hereinafter) 107 includes a means (photoelectric microscope or television camera) for photoelectrically detecting the reticle alignment marks 52, 55 and 58 shown in FIG. 1 through the reticle alignment optical systems 50, 51 and 53, and also includes a means for detecting displacement of the reticle alignment marks 52, 55 and 58 with respect to a predetermined detection center in accordance with the photoelectrical signals from the photoelectric detecting means and for driving the reticle holder (not shown) for holding the reticle so that the displacements of the marks 52, 55 and 58 become zero. The R-ALG 107 aligns the reticle with respect to the apparatus so that the optical axis of the projection lens 6 passes the center of the reticle.

A focus detecting means (to be referred to as an AFD hereinafter) 108 detects an interval between the wafer and the projection lens 6 or an interval between the reference mark plate FM and the projection lens 6 so as to determine a defocusing amount of the projection lens 6, i.e., a displacement between the imaging plane of the projection lens 6 and a surface of the wafer (or the surface of the reference mark plate FM) along the optical axis.

The AFD 108 can be a detector which obliquely irradiates the surface of the wafer and detects the direction of the reflected light, or a detector which blows air onto the wafer and detects changes in back pressure of the air. When the Z-ACT 106 is driven in accordance with the detected defocusing amount, the pattern image of the reticle 5 is formed on the wafer in a correctly focused state. An LSA processing circuit 109 receives photoelectric signals from the photosensor 25 of the Y-LSA detection system and the photosensor of the X-LSA detection system. In cooperation with the CPU 100, the LSA processing circuit 109 detects the positional errors between the spots LX and LY and the alignment marks on the wafer or the reference marks FMX and FMY of the reference mark plate FM.

The photoelectric signals from the photosensors 45 and 48 of the Y and Θ alignment detection systems are processed by a wafer alignment processing circuit (to be referred to as a WAD hereinafter) 110. Thus, the displacements between the marks on the wafer and the spots MYS and MΘS along the y-axis direction are detected.

Figure 7:
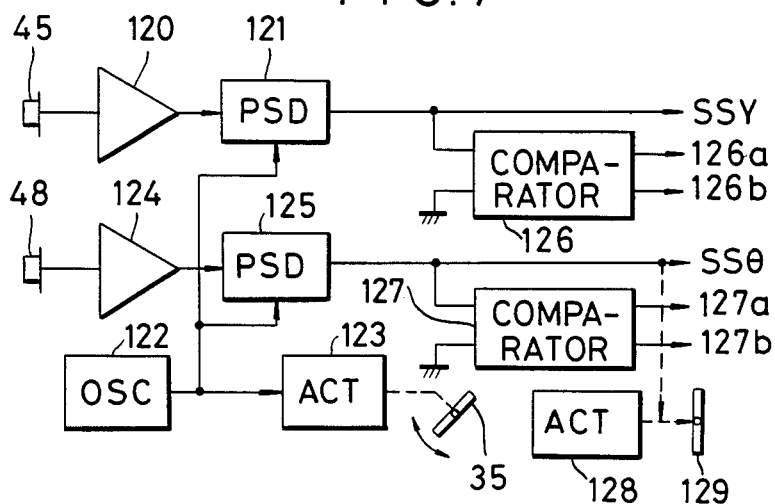
FIG. 7 is a block diagram of Y and $\Theta$ alignment detection systems.

FIG. 7 shows the circuit configuration of the WAD 110. A photoelectric signal from the photosensor 45 of the Y alignment detection system is supplied to a phase sync detector (to be referred to as PSD hereinafter) 121.

Figure 8:
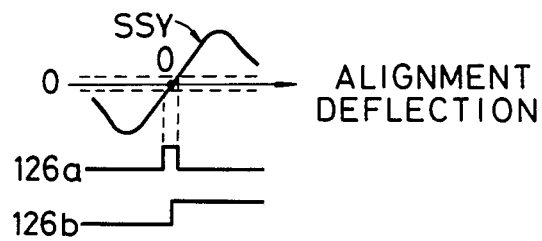
FIG. 8 shows signal waveforms of detection output signals from a phase sync detector corresponding to misalignment or alignment deflection.

An oscillator 122 supplies an oscillation signal for oscillation at a predetermined frequency to an actuator 123. The actuator 123 causes simple harmonic motion of the mirror 35 shown in FIG. 1 at the frequency of the received oscillation signal. The PSD 121 performs sync detection (sync rectification) of the photoelectric signal from an amplifier 120 and produces a detection signal SSY. The detection signal SSY is an S-curve signal corresponding to the deviation (alignment deflection) of the mark position with respect to the oscillation center of the spot MYS, as shown in FIG. 8. When the detection signal SSY has positive polarity, the mark is displaced in one direction with respect to the oscillation center of the spot MYS. When the detection signal SSY is zero, the oscillation center of the spot MYS coincides with the center of the mark. Thus, a comparator 126 produces a signal 126a when the detection signal SSY is zero, and a signal 126b which goes high (H) when the detection signal SSY is positive and goes low (L) when the signal SSY is negative. However, due to noise or the like, it is difficult to correctly detect if the detection signal SSY is zero. Therefore, the comparator 126 comprises a window comparator which produces a signal 126a when the level of the detection signal SSY falls within a predetermined range including zero. This also applies to the Θ alignment detection system. That is, a photoelectric signal from the photosensor 48 is amplified by an amplifier 124, an amplified signal from which is supplied to a PSD 125. The PSD 125 performs sync detection of the photoelectric signal in accordance with an oscillation signal from the oscillator 122 and produces a detection signal (S curve signal) SSΘ. A comparator 127 digitizes the detection signal SSΘ, and produces a signal 127a representing that the detection signal SSY has become zero and a signal 127b representing the direction of deviation of the mark with respect to the oscillation center of the spot MΘS.

In FIG. 7, an actuator 128 which receives the detection signal SSΘ rotates through a predetermined angle a parallel glass plate (plane parallel) 129 arranged in a light path of the Θ alignment detection system and between the beam splitters 39 and 42. When the plane parallel 129 rotates, the optical axis of the laser beam passing therethrough is shifted and the oscillation center of the spot MΘS is displaced by a small distance along the y-axis direction. Although the actuator 128 and the plane parallel 129 are not absolutely necessary, they are included out of consideration for long-term drift and for parallel formation of the spots MYS and MΘS, i.e., for adjustment so that the line segment connecting the oscillation centers of the spots MYS and MΘS becomes parallel to the x-axis, as shown in FIG. 3.

Figure 9:
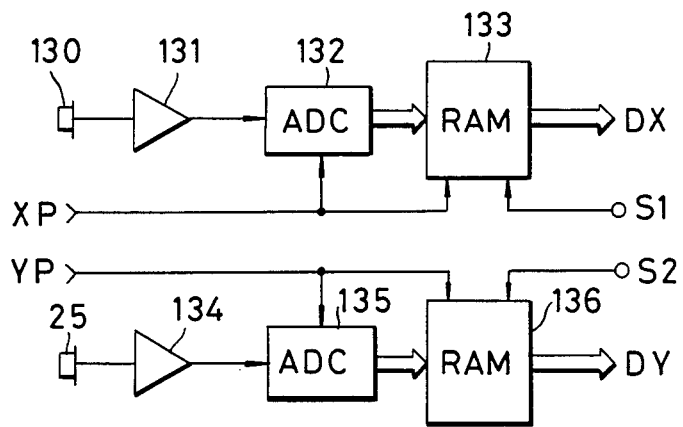
FIG. 9 is a block diagram of X- and Y-laser step alignment detection systems.

FIG. 9 shows the circuit configuration of the LSA processing circuit 109. A photosensor of the X-LSA detection system corresponding to the photosensor 25 of the Y-LSA detection system is referred to as a photosensor 130. The photosensor 130 receives through the projection lens 6 diffracted light from the alignment mark along the x-axis direction on the wafer or from the reference mark FMX. A photoelectric signal from the photosensor 130 is amplified by an amplifier 131 and the amplified signal is supplied to an analog-to-digital converter (to be referred to as an ADC hereinafter) 132. In response to each pulse $X_p$ from the laser interferometer 10, the ADC 132 converts the input photoelectric signal into digital data representing the amplitude thereof. The digital data is stored in a random access memory (to be referred to as a RAM hereinafter) 133 which is sequentially addressed by each pulse $X_p$. The storage start or stop of the data in the RAM 133 is controlled by a signal $S_1$ from the CPU. This also applies to the Y-LSA detection system. A photoelectric signal from the photosensor 25 is amplified by an amplifier 134. The amplified signal from the amplifier 134 is converted into digital data by an ADC 135 and is stored in a RAM 136. The ADC 135 samples the photoelectric signal in response to each pulse $Y_p$ from the laser interferometer 104. The RAM 136 stores the sampled digital data at addresses which are updated in response to each pulse signal $Y_p$. The storage start and stop of the RAM 136 is controlled by a signal $S_2$.

In this manner, the data obtained by sampling the intensity distribution of the diffracted light from the mark at a period corresponding to each position upon unit displacement (e.g., 0.02 μm) of the stage 7 is stored in the RAMs 133 and 136. The data groups stored in the RAMs 133 and 136 in this manner are fetched in the CPU and are used for mark position detection.

The alignment operation of the wafer will be described with reference to FIG. 10.

Figure 11:
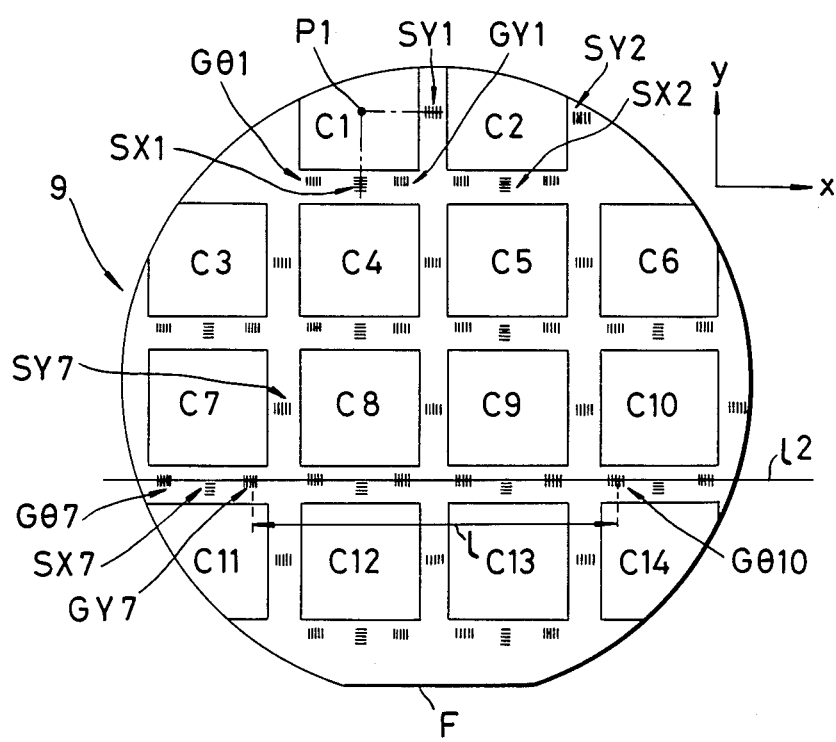
FIG. 11 is a plan view showing the arrangement of a mark and an exposure region on a wafer.

First, a wafer is prealigned on the wafer holder 8. This is performed by a prealignment apparatus (not shown) utilizing a linear orientation flat of the wafer. Alignment marks and a first circuit pattern layer are formed on the wafer placed on the wafer holder 8. FIG. 11 illustrates the wafer in this state. Rectangular exposure regions $C_1, C_2, \ldots, C_{14}$ with the first circuit pattern layer formed thereon are aligned on the wafer in a matrix form. The respective exposure regions C are transferred onto the wafer in a single exposure operation by a reducing projection exposure apparatus. Four alignment marks are simultaneously formed around (e.g., on scribe lines) each region C. For example, the region $C_1$ is surrounded by marks $SY_1$ and $SX_1$ which radially extend from a center $P_1$ of the region and are perpendicular to each other, and two marks $GY_1$ and $GΘ_1$ arranged at a predetermined interval therebetween on a single line. Each of these marks is an array of short line segments which emits diffracted light upon radiation with elliptical laser beams as in the case of the reference marks FMY and FMX. The details of these marks will be described hereinafter. When the wafer is placed or prealigned on the wafer holder 8, the extending direction of an orientation flat F of the wafer is aligned with the x-axis direction of the x-y coordinate system of the stage 7. The marks $SY_1$, $GΘ_1$ and $GY_1$ extend along the x-axis direction, while the mark $SX_1$ extends along the y-axis direction. Marks $GY_7$ and $GΘ_{10}$ surrounding two separate exposure regions $C_7$ and $C_{10}$ on the wafer are used to correct rotational misalignment of the wafer. A line segment $l_2$ connecting the marks $GY_7$ and $GΘ_{10}$ is parallel to the flat F and the x-axis of the x-y coordinate system. The interval between the marks $GY_7$ and $GΘ_{10}$ is set to equal an interval l between the two spots MYS and MΘS formed by the off-axis alignment detection systems. The marks SY and SX are detected by the TTL LSA detection systems and must be formed for each exposure region in order to achieve alignment with the reticle 5. However, the marks GY and GΘ need not always be formed except for the marks $GY_7$ and $GΘ_{10}$. For example, when the first circuit pattern layer as shown in FIG. 11 is transferred not using the reducing projection exposure apparatus but using an exposure apparatus which transfers the entire circuit pattern onto the wafer, a mask pattern corresponding to the marks SY and SX for each exposure region C and a mask pattern corresponding to the marks GY$_7$ and GΘ$_{10}$ spaced by the interval 1 must be formed on a photomask for entire circuit pattern transfer.

Figure 12:
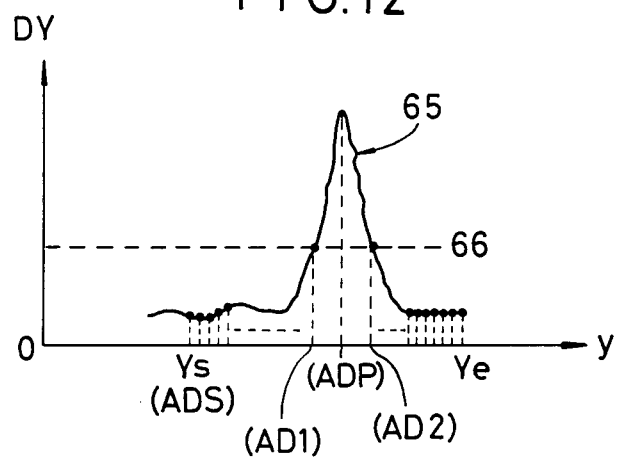
FIG. 12 is a chart showing an intensity distribution pattern of diffracted light which is extracted by the circuit shown in FIG. 9.

When wafer loading is completed in this manner, as shown in FIG. 3, a distance YLY (y-coordinate) of the spot LY from the x-axis and a distance XLX (x-coordinate) of the spot LX from the y-axis are measured. The CPU moves the stage 7 so that the spot LY formed by the Y-LSA detection system scans the reference mark FMY along the y-axis direction. In this case, the spot LY and the reference mark FMY are first aligned at positions as shown in FIG. 4, and thereafter the stage 7 is moved for a predetermined distance along the y-axis direction. The CPU reads the position of the stage as the start position YS through the laser interferometer 104. After the CPU supplies a signal S$_2$ to the LSA processing circuit 109, it moves the stage 7 for a predetermined distance along the y-axis direction to the spot position Ye. Along with this movement, the photoelectric signal from the photosensor 25 is sampled by the ADC 135 as shown in FIG. 9 in response to each pulse signal YP from the laser interferometer 104. Thus, the RAM 136 sequentially stores a data group representing the light intensity distribution of the diffracted light from the reference mark FMY. This state is illustrated in FIG. 12. In FIG. 12, the magnitude of sampled data DY is plotted along the ordinate, and the y-coordinate of the stage is plotted along the abscissa. A waveform 65 represents the intensity distribution of diffracted light produced between the positions YS and Ye. When the stage 7 moves to the position Ye and stops, the CPU fetches the data DY from the RAM 136 and detects an address interval between addresses AD1 to AD2 in which the data DY is greater than a predetermined reference level 66. Each address of the RAM 136 corresponds to one pulse YP, i.e., a displacement of 0.02 μm of the stage along the y-axis direction. The CPU calculates an address ADP between the addresses AD1 to AD2 at which the data DY becomes maximum and calculates the difference between an address ADS corresponding to the position YS and the address ADP, i.e., (ADP−ADS). The CPU multiplies this difference with an interval P (0.02 μm) corresponding to the pulse width of the pulse YP so as to calculate a distance between the position YS and a position corresponding to the maximum amplitude of the waveform 65. Finally, the CPU adds the position YS and the distance so as to calculate a y-coordinate YR2 at which the waveform 65 has a maximum amplitude. Therefore, when the stage is returned from the position Ye so that the y-coordinate of the stage read by the laser interferometer 104 becomes YR2, the spot SY correctly coincides with the reference mark FMY. When the maximum amplitude of the waveform 65 is not a peak value depending on the mark size or the spot size, i.e., when the waveform 65 has a rectangular waveshape, the central address between the addresses AD1 and AD2 crossing the reference level 66 can be defined as the address ADP.

In this state, the reticle 5 is assumed to be aligned by the reticle alignment optical systems 50, 51, and 53 and the R-ALG 107. First, the reticle alignment optical system 50 moves the stage 7 so that the inverted projection image of the reference mark FMY formed by the projection lens 6 and the mark 52 of the reticle hold a predetermined positional relationship. A detection center 50W of the reticle alignment optical system 50 is aligned with the reference mark FMY. The CPU reads the y-coordinate YR1 of the stage at this point from the laser interferometer 104.

The CPU then calculates the difference between the y-coordinate YR2 at which the reference mark FMY is aligned with the spot LY and the y-coordinate YR1 to calculate the distance YLY.

The distance XLX from the y-axis (x-coordinate) of the spot LX of the X-LSA detection system is measured as shown in FIG. 3. In this case, an x-coordinate XR1 at which the detection center 53W of the reticle alignment optical system 53 coincides with the reference mark FMX is detected. Thereafter, the stage 7 is moved so that the spot LX scans the reference mark FMX for a predetermined distance along the x-axis. The ADC 132 and the RAM 133 shown in FIG. 9 operate to extract the intensity distribution of the diffracted light from the reference mark FMX. In accordance with a similar calculation as described above, an x-coordinate XR2 is detected at which the reference mark FMX is aligned with the spot LX, and a distance XLX is calculated in accordance with XLX=XR1−XR2.

When STEP 2 (FIG. 10) is completed in this manner, the CPU aligns the stage 7 so that the reference mark plate FM is located immediately below the projection lens 6. The AFD 108 and the Z-ACT 106 are used to automatically focus on the reference mark plate FM.

Figure 13:
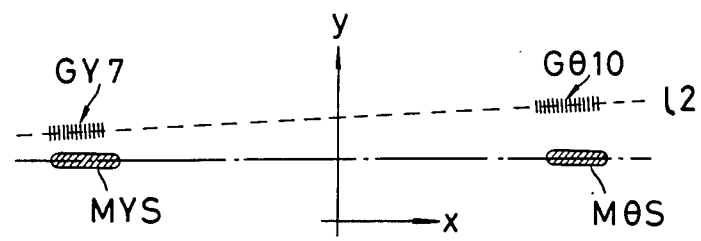
FIG. 13 is a plan view showing marks and spots after prealignment.

Subsequently, the Θ alignment of the wafer in STEP 4 is performed. The CPU prealigns the mark GY$_7$ on the wafer with the spot MYS of the Y alignment detection system and positions the state 7 so that the mark GΘ$_{10}$ is prealigned with the spot MΘS of the Θ alignment detection system. This alignment can be easily performed within an allowable precision tolerance if the distance between the reference mark plate FM and the wafer is known, the positions of the marks GY$_7$ and GΘ$_{10}$ (line segment l$_2$) with reference to the wafer are known, and the distances between the exposure center O (origin O in FIG. 3) of the projection lens 6 and the spots MYS and MΘS are known. However, since a prealignment error of the wafer is left uncompensated, the spots MYS and MΘS are shifted from the marks GY$_7$ and GΘ$_{10}$ by distances corresponding to this prealignment error. This state is illustrated in FIG. 13. The wafer has a misalignment along the y-axis and a rotational misalignment with respect to the line segment l$_2$ connecting the spots MYS and MΘS. Although there is a misalignment along the x-axis, this does not present any practical problem since the spots MYS, MΘS and the marks GY$_7$ and GΘ$_{10}$ are elongated along the x-axis. After the stage 7 is aligned as shown in FIG. 13, the CPU moves the stage 7 along the y-axis and calculates the moving direction of the stage 7 in accordance with the logic value of the signal 126b or 127b from the WAD 110 shown in FIG. 7. When the signal 126a or 127a goes high, the CPU detects the y-coordinate of the stage 7 and then stops the stage. If there is a difference between the y-coordinate at which the mark GY$_7$ coincides with the spot MYS and the y-coordinate at which the mark GΘ$_{10}$ coincides with the spot MΘS, this means that the wafer is rotated. The sign (positive or negative) of the difference indicates the rotated direction of the wafer. The CPU first detects the rotated direction. For example, in FIG. 13, the wafer is rotated in the counter-clockwise direction. The CPU then returns the stage along the y-axis until the signal 126a from the WAD 110 goes high.

Then, the center of the mark GY$_7$ along the y-axis and the oscillation center of the spot MYS are aligned within a precision which is determined by the window width of the comparator 126. When this process is completed, the CPU fetches the detection signal SSY from the PSD 121 and switches the Y-ACT 103 to the servo control (feedback control) so that the analog level of the detection signal SSY becomes zero. Then, the center of the mark $GY_7$ along the y-axis correctly coincides with the oscillation center of the spot MYS, and this state is maintained by the servo control. Thereafter, the CPU drives the Θ-ACT 105 to rotate the wafer holder 8 in a direction opposite to the rotated direction of the wafer 7. In this process, the CPU performs servo control of the Θ-ACT 105 so that the detection signal SSΘ from the PSD 125 of the WAD 110 becomes zero. When this operation is performed, the center of the mark $GY_7$ coincides with the oscillation center of the spot MYS, the center of the mark $GΘ_{10}$ coincides with the oscillation center of the spot MΘS, the rotational misalignment of the wafer is corrected, and the y-coordinate of the wafer is determined. In STEP 5, the CPU reads the y-coordinate of the stage 7 from the laser interferometer 104 and sets (stores) it in the memory. Thus, the reference position YG along the y-axis with reference to the exposure center O is determined.

In STEP 6, the CPU moves the stage 7 so that a region on the wafer to be exposed first, e.g., the region $C_1$ in FIG. 11 is positioned within the effective exposure region 60 of the projection lens. The position of each region C in the wafer is predetermined when the first circuit pattern layer is formed, and the position of the center $P_1$ of the region $C_1$ with reference to the marks $GY_7$ and $GΘ_{10}$ is also determined. When the distances between the marks $GY_7$ and $GΘ_{10}$ (line segment $l_2$) and the center $P_1$ along the y-axis are defined as YP1, if the stage 7 is aligned so that the y-coordinate of the stage satisfies:

$$Y = YG + Y_1 - YP1 \qquad (1)$$

the y-coordinate of the center $P_1$ and that of the exposure center O of the projection lens 6 are aligned. Since the distances between the marks $GY_7$ and $GΘ_{10}$ and the center $P_1$ along the x-axis are known, the stage 7 is prealigned.

Figure 14:
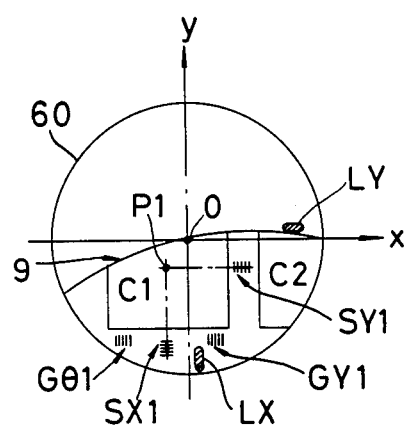
FIGS. 14 and 15 are plan views showing the alignment operation according to the TTL system.

The mark $SX_1$ corresponding to the region $C_1$ is detected by the TTL X-LSA detection system, and the x-coordinate of the mark $SX_1$ is calculated. This operation will be described with reference to FIG. 14. FIG. 14 shows the arrangement of the wafer and the spots LX and LY inside the effective exposure region 60 of the projection lens. When the wafer is aligned on the imaging plane of the projection lens by automatic focusing after the exposure center O is aligned with the center $P_1$ of the region $C_1$ along the y-axis, the stage 7 is moved along the y-axis so that the spot LX is aligned with the mark SX1 along the x-axis, as shown in FIG. 14. More specifically, the stage 7 is moved along the y-axis for a distance corresponding to the difference between the distance Y2 between the exposure center O and the spot LX and the distance (predetermined at the stage of design) between the center $P_1$ and the mark $SX_1$. Thereafter, without moving the stage along the y-axis, the stage 7 is moved for a predetermined distance along the x-axis. The moving distance is determined to be a sufficiently greater value than the x-axis misalignment which is determined by the prealignment precision of the wafer including the mark $SX_1$. During the movement of the stage, the CPU controls the ADC 132 and the RAM 133 shown in FIG. 9 so as to extract the intensity distribution of the diffracted light from the mark $SX_1$. Thereafter, the CPU performs a similar operation to that shown in FIG. 12, calculates the x-coordinate of the stage at which the center of the spot LX along the x-axis and the center of the mark $SX_1$ along the x-axis coincide, and stores the calculated x-coordinate as the position XC1. When this position XC1 is calculated, it means that the x-coordinate of the wafer is determined with reference to the exposure center O. Thus, global alignment of the wafer along the x-axis (overall alignment of the wafer) is completed.

Figure 15:
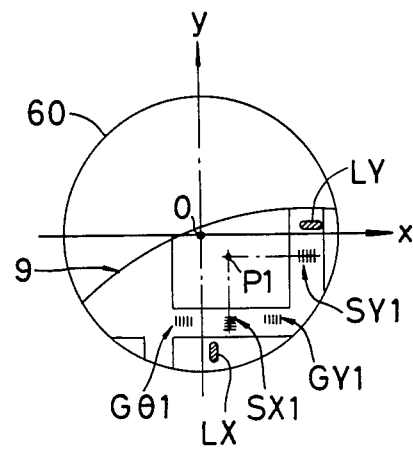

The CPU executes the Y-LSA search in STEP 9. As shown in FIG. 15, after the stage is positioned so that the spot LY is aligned with the mark $SY_1$ along the y-axis, the stage 7 is moved for a predetermined distance along the y-axis, and detects the y-coordinate at which the center of the mark $SY_1$ along the y-axis is aligned with the center of the spot LY along the y-axis. The CPU calculates this position in accordance with the intensity distribution of the diffracted light from the mark $SY_1$ obtained from the ADC 135 and the RAM 136 of the LSA processing circuit 109 and stores the calculated position as the position YC1.

Then, the CPU finely aligns the region $C_1$ with the projection image of the reticle 5 in accordance with the positions XC1 and YC1, and the distances XLX and YLY of the spots LX and LY from the x- and y-axes, in the fine alignment STEP 10. More specifically, the stage 7 is two-dimensionally moved so that the measurements obtained from the laser interferometers 10 and 104 for reading the position of the stage satisfy:

$$x = XC1 - XLX \qquad (2)$$

$$y = YC1 - YLY \qquad (3)$$

Then, the center $P_1$ of the region $C_1$ is correctly aligned with the exposure center O, thereby completing fine alignment. At this point, the CPU opens the shutter 3 shown in FIG. 1 for a predetermined period of time so as to expose (print) the circuit pattern of the reticle on the region $C_1$ of the wafer.

Next, the CPU checks if N exposures on the wafer have been completed. In this case, since only a single exposure has been completed, the CPU moves the stage for a predetermined pitch along the x-axis, i.e., for a distance corresponding to the interval between the regions $C_1$ and $C_2$ from the positions XC1 and YC1, in STEP 11. Thereafter, the CPU repeatedly executes the same operation from the step of focusing in STEP 7. In this manner, alignment of each region with the reticle is repeated with the spots LX and LY, i.e., prealignment exposure is repeated N times. Then, the flow advances to STEP 12, and the exposed wafer on the stage is fed out (unloaded). The process from STEP 1 is performed again for printing the next wafer.

Figure 16:
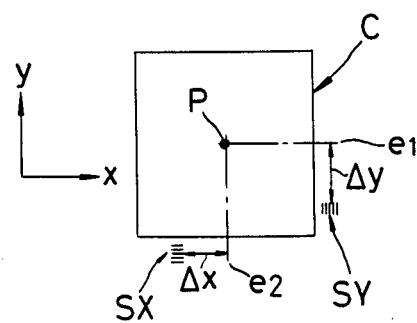
FIG. 16 is a plan view showing an example of a mark which is deviated from the center of the exposure area.

In the above embodiment, the marks SX and SY for detection by the TTL system are arranged on two orthogonal lines intersecting at the center P of each region C. However, the arrangement of the marks SX and SY is not limited to this. For example, as shown in FIG. 16, the marks SX and SY can be arranged having predetermined offset amounts with respect to lines $e_1$ and $e_2$ (the intersection corresponds to the center P) which are perpendicular to each other. If the line $e_1$ is parallel to the x-axis and the line $e_2$ is parallel to the y-axis, the mark SX extending along the y-axis is formed offset by an offset amount Δx from the line e₂ and the mark SY extending along the x-axis is formed offset by an offset amount Δy from the line e₁. The offset amounts Δx and Δy are predetermined design values. In such a case, when fine alignment is performed, the stage 7 is positioned in accordance with the following equations:

$$x = XC_i - XLX - \Delta x \quad (2')$$

$$y = YC_i - YLY - \Delta y \quad (3')$$

(where i is the number (1, 2, ..., N) of each region) in place of the equations (2) and (3) above. Then, the region C can be correctly aligned with the projection image of the reticle 5.

In the above embodiment, step alignment by the TTL system is performed for all regions C. This is performed to eliminate the adverse influence of the alignment error of each region due to expansion/contraction of the wafer and to allow precise alignment of each region with the projection image of the reticle. However, when expansion/contraction of the wafer is considered to be negligible or the amount of such expansion/contraction is known, the step alignment by the TTL system need be performed only for the first region $C_1$ and can be omitted for the remaining regions.

If the amount of expansion/contraction of the wafer is small, the entire surface of the wafer is divided into a plurality of blocks, e.g., 4 blocks and step alignment by the TTL system can be performed for a specific region within each block.

Another alignment operation in accordance with the embodiment of the present invention will now be described. In the above embodiment, the rotational misalignment of the wafer is corrected by alignment in accordance with the off-axis detection system, and the y-coordinate of the wafer (stage) is determined (global alignment along the y-axis).

Figure 17:
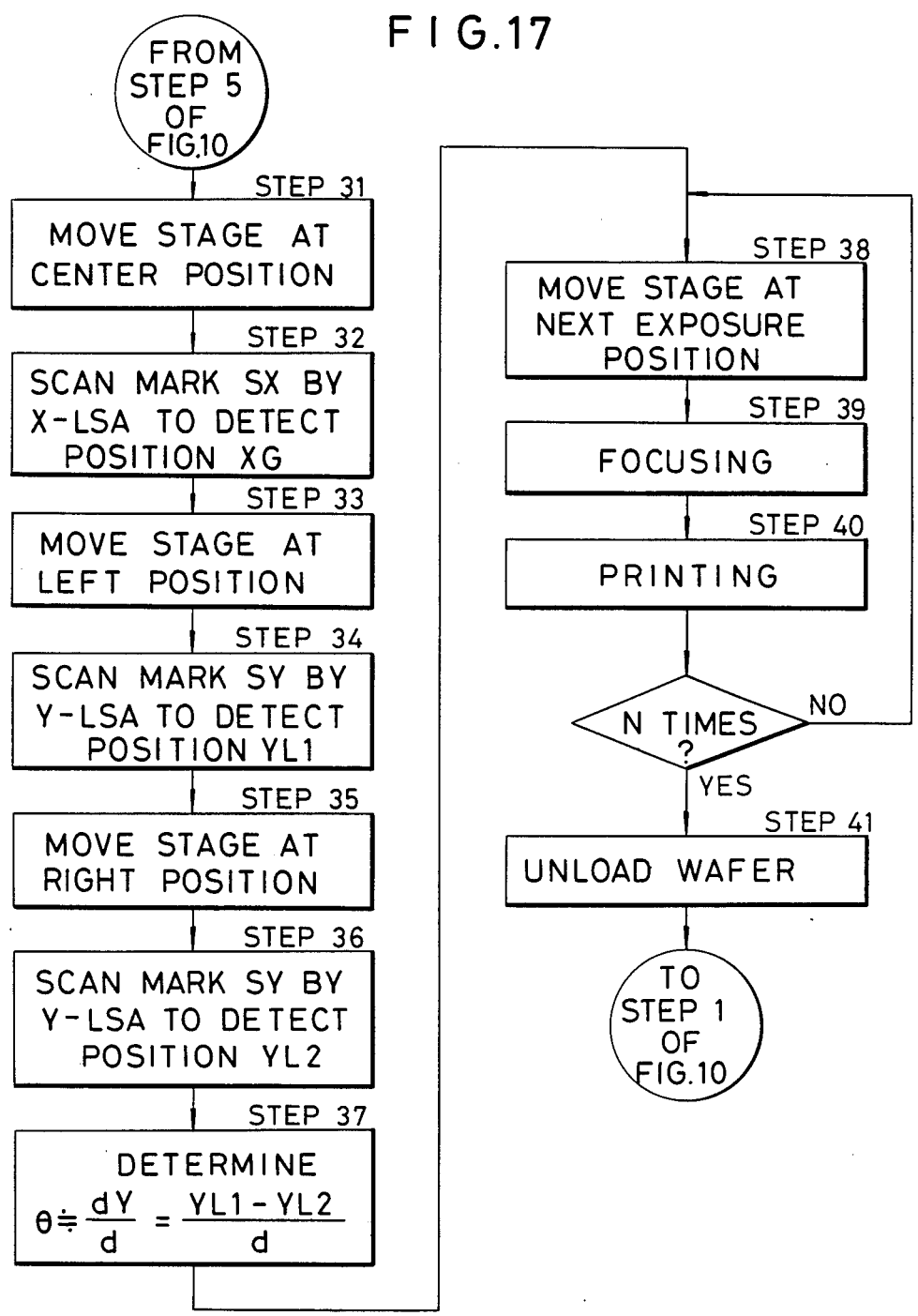
FIG. 17 is a flow chart for explaining the alignment operation according to the embodiment of the present invention.

For this reason, the alignment precision along the y-axis and the rotated direction of the wafer depends upon the position setting precision of the spots MYS and MΘS by the Y and Θ alignment detection systems of off-axis type. Thus, if the line connecting the oscillation center of the spot MYS and the oscillation center of the spot MΘS is even slightly inclined with respect to the x-axis, the step alignment of the stage results in misalignment between the exposure region and the projection image of the reticle in accordance with the magnitude of the inclination angle of this line. If the spots MYS and MΘS are shifted along the y-axis direction in this manner, a rotational error (wafer rotation error) of the overall wafer becomes significant. The operation for correcting this residual rotational error will be described with reference to the flow chart shown in FIG. 17.

Figure 10:
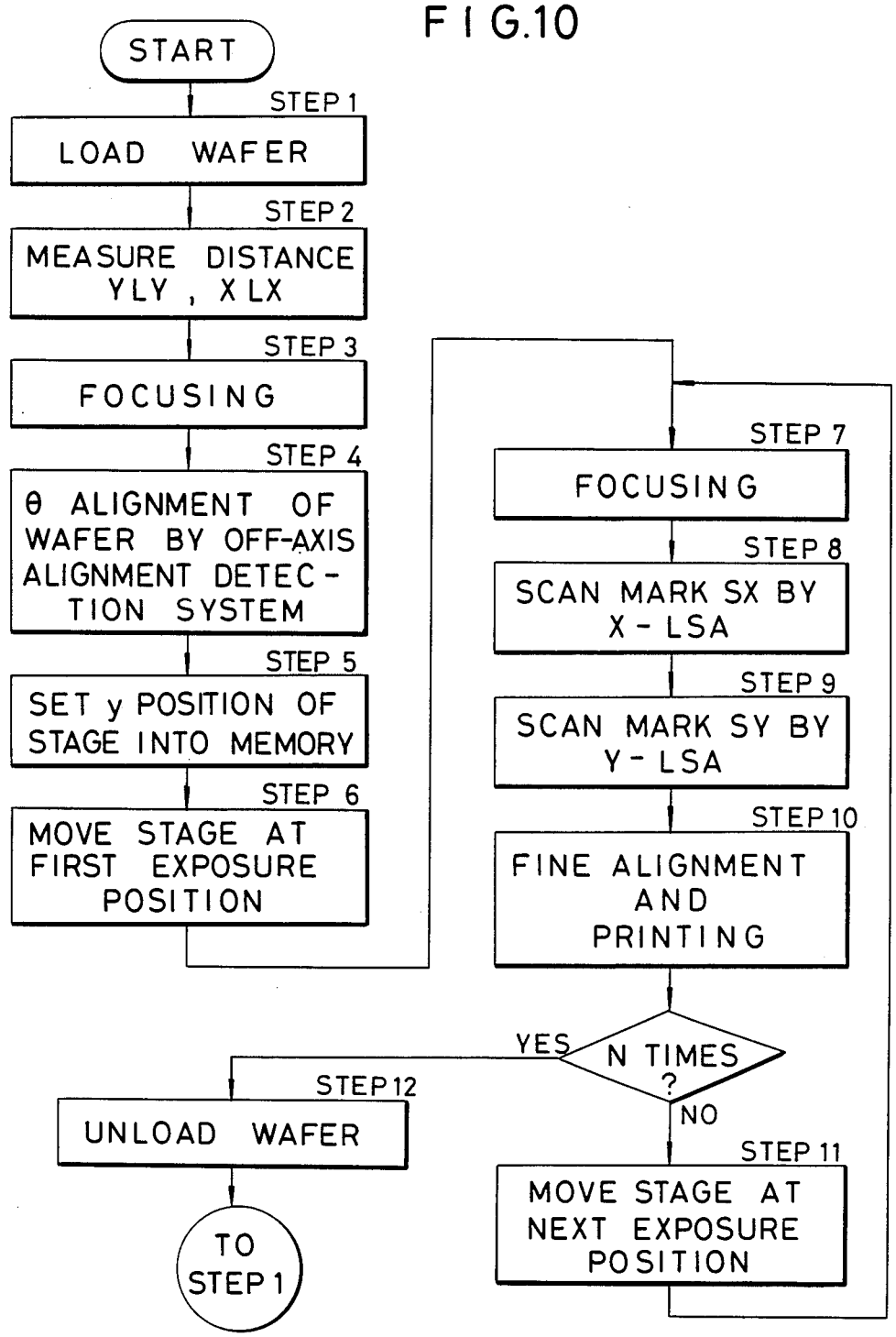
FIG. 10 is a flow chart for explaining the alignment operation in an embodiment of the present invention.
Figure 18:
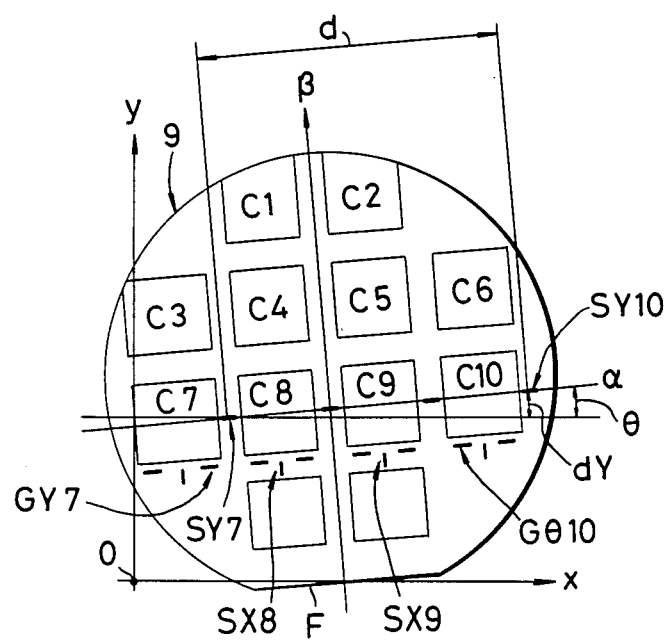
FIG. 18 is a plan view showing a small rotational error of the wafer.

In this embodiment, the processing from the loading of the wafer to the y-coordinate setting of the stage is the same as in STEPs 1 to 5 in FIG. 10. After STEP 5 is completed, it is assumed that the wafer is positioned with a rotational error of Θ with respect to the x-y coordinate system as shown in FIG. 18 in accordance with the setting error of the spots MYS and MΘS. The angle Θ is the amount of the wafer rotational error. The coordinate system of each exposure region of the wafer 9 is determined as an $\alpha - \beta$ coordinate system, and the origin of this system is set at a position as close to the center of the wafer as possible. The α-axis of the $\alpha - \beta$ coordinate system is determined to pass marks $SY_7$, $SY_8$, $SY_9$ and $SY_{10}$ of regions $C_7$, $C_8$, $C_9$ and $C_{10}$ parallel to the orientation flat F of the wafer. The β-axis passes the centers of the marks $SX_8$ and $SX_9$ of the two central regions $C_8$ and $C_9$ and is perpendicular to the α-axis. The coordinates of the center $P_i$ of each region $C_i$ on the wafer are defined on the $\alpha - \beta$ coordinate system and are given by ($\alpha_i$, $\beta_i$).

In STEP 31 following STEP 5, the CPU selects a region which is closest to the center of the wafer, e.g., the region $C_8$. Then, the CPU moves the stage to a position at which the mark $SX_8$ of the region $C_8$ is aligned with the spot LX, i.e., to the center position along the x-axis, and thereafter performs automatic focusing. In STEP 32, the CPU scans the spot LX on the mark $SP_8$ along the x-axis, detects the x-coordinate XG of the stage at which the center of the mark $SX_8$ along the x-axis is aligned with the center of the spot LX along the x-axis, and stores this position in the memory. Upon these operations, the global alignment of the wafer is completed, and the position of the wafer in the x-y coordinate system is defined.

In STEP 33, the stage is moved to the left position at which the mark $SY_7$ corresponding to the exposure region $C_7$ at a position near the extreme right end of the wafer along the α-axis is aligned with the spot LY along the y-axis. Then, automatic focusing is performed. Next, the mark $SY_7$ is scanned with the spot LY along the y-axis, and the central position YL1 of the mark SY7 along the y-axis is detected and stored. In STEP 35, the stage is moved to the right position at which the mark $SY_{10}$ of the exposure region $C_{10}$ located at a position near the extreme right end of the wafer along the α-axis is aligned with the spot LY along the y-axis. Then, automatic focusing is performed. The mark $SY_7$ is scanned with the spot LY, and the central position YL2 of the mark $SY_{10}$ along the y-axis is detected and stored.

The CPU calculates the rotational amount Θ of the wafer in accordance with the difference between the positions XL1 and YL2 and an interval d between the marks $SY_7$ and $SY_{10}$ along the α-axis. When the difference between the positions YL1 and YL2 is represented by dY, as shown in FIG. 18, the rotational amount Θ is given by:

$$\Theta = \sin^{-1}(dY/d) \quad (4)$$

Since the rotational amount Θ is a very small amount, the equation (4) can be given as an approximation:

$$\Theta \approx dY/d = (YL1 - YL2)/d \quad (5)$$

When the center $P_i$ of each exposure region $C_i$ of the wafer is aligned with the exposure center O by stepping, the position of the stage is corrected from the position determined by the stepping pitch by the amounts given by the following equations (6) and (7):

$$\delta X = \beta_i \cdot \Theta = \beta_i(dY/d) \quad (6)$$

$$\delta Y = -\alpha_i \cdot \Theta = -\alpha_i(dY/d) \quad (7)$$

In STEP 38, the CPU 100 calculates the position of the first exposure region $C_1$ in the x-y coordinate system in accordance with the position (XG, YG) and then steps the stage 7 after correcting by the amounts (δX, δY) given by the equations (6) and (7). Automatic focusing is then performed in STEP 37, and the projection image of the circuit pattern on the reticle is exposed (printed) on the region $C_1$ of the wafer in STEP 38. The CPU checks if N exposure operations have been completed. If the exposure operations on the entire surface of the wafer are not completed, the operation starting from STEP 38 is repeated. However, if N exposure operations have been completed, the wafer is unloaded in STEP 41.

In this manner, according to this embodiment, the Y and Θ alignment detection systems of the off-axis method and the X-LSA detection system of TTL method are used to perform global alignment of the wafer. The correspondence between the α−β coordinate system and the x-y coordinate system is obtained as the position (YG, XG). Thereafter, stepping is performed without step alignment with reference to the position (YG, XG), and wafer exposure is performed. Therefore, the processing time of a single wafer is shortened, and the remaining small rotational error of the wafer is corrected during stopping. Therefore, superposition exposure is performed with a uniform alignment precision for each exposure region of the wafer.

In the above embodiment, the stage is positioned to allow correction of the wafer rotational error during stepping. However, this operation can be similarly performed in the first embodiment. More specifically, after the stage is located during stepping at the position which includes the wafer rotational error, step alignment by the TTL method can be performed to achieve fine alignment. In each embodiment described above, after the stage is positioned, automatic focusing is performed before exposure. However, automatic focusing can be performed while the stage is moving or during exposure.

Figure 19:
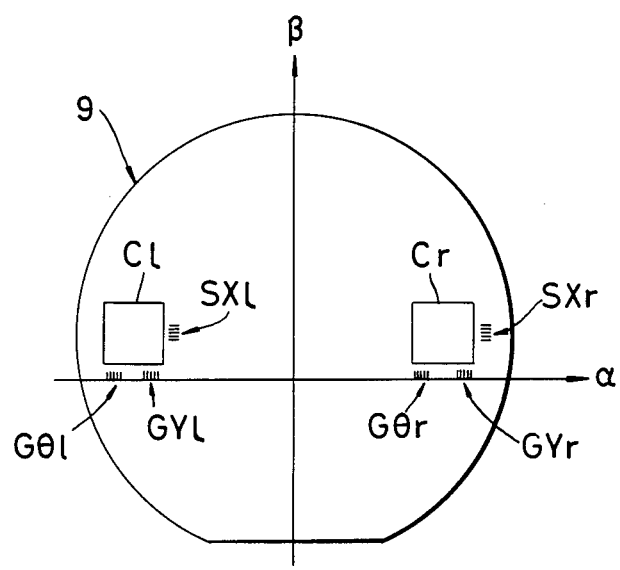
FIG. 19 is a plan view showing another arrangement of alignment marks on a wafer.

In the alignment operation according to the embodiments of the present invention, the Y and Θ alignment detection systems of the off-axis method need not be detection systems of laser spot oscillation type. Thus, a similar effect can be obtained with laser spot detection systems of constant speed scanning type, or detection systems wherein a wafer is illuminated with incoherent light, an image of an alignment mark is formed by an objective lens, and the image is slit exposed or received by an image pickup element, thereby detecting the position of the mark. In a detection system wherein the beam spot irradiates the wafer, the beam spot need not have an elliptical shape but can be a small circular spot. As in the case of the X-LSA and Y-LSA detection systems of the TTL method, the Y and Θ alignment detection systems of off-axis method can be used to extract the intensity distribution pattern of diffracted light without oscillating the spots MYS and MΘS. Furthermore, separate marks SX, SY, GY and GΘ are formed for the off-axis and TTL systems. However, the same marks can be used for both off-axis and TTL systems. For example, as shown in FIG. 19, the alignment marks GY and GΘ for the off-axis system are formed for each region C in the manner as described above. In FIG. 19, only two exposure regions Cl and Cr are shown in the wafer 9. Marks GΘl and GYl and marks GΘr and GYr are those for global alignment (y-axis and rotational direction) by the off-axis system. In this case, the marks GYl and GΘr are formed to pass the α-axis of the α−β coordinate system. An interval between the two marks is set to be equal to that between spots MYS and MΘS. Marks SXl and SXr are also formed for alignment of the regions Cl and Cr by the TTL system so as to extend parallel to the β-axis. When alignment for each region (step alignment) is performed, the spot LX of the X-LSA detection system scans the marks SXl and SXr, and the spot LY of the Y-LSA detection system detects the marks GΘl and GΘr (or the marks GYl and GYr). When alignment marks are used by both the off-axis and TTL systems, the circuit pattern area which can be exposed can be increased.

Figure 20A:
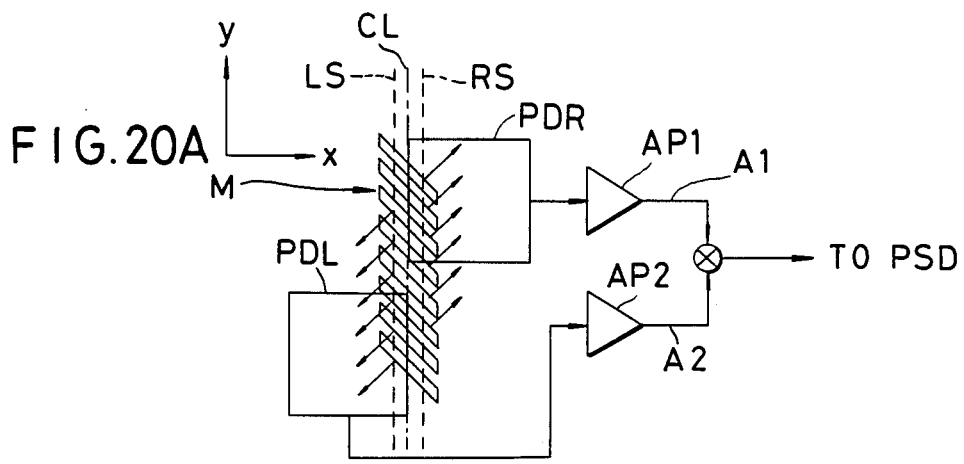
FIG. 20A shows a mark and a circuit diagram of a detector for detecting the mark according to a modification of the present invention.

In the above embodiment, each alignment comprises an array of short line segments extending along the alignment direction and arranged along a direction perpendicular to the alignment direction. In general, lines or edges in the circuit pattern are also aligned with the small line segments of the mark. When each spot scans the wafer, the circuit pattern itself may generate intense diffracted light equivalent to that received from the mark. In order to prevent this, as disclosed in U.S. Pat. No. 4,423,959 issued on Jan. 3, 1984, the line segments can be inclined at 45°. As shown in FIG. 20A, photosensors PDL and PDR are arranged to be offset along the y-axis and to be opposed about a central line CL of a mark M along the x-axis. When the central line along the widthwise direction (or x-axis) of the spot is aligned with the central line CL, the photosensor PDR receives diffracted light from the upper right portion of the mark M, while the photosensor PDL receives diffracted light from the lower left portion of the mark M. Photoelectric signals $A_1$ and $A_2$ from the photosensors PDR and PDL are amplified by amplifiers AP1 and AP2, and the amplified signals are added. The obtained sum signal is processed as a diffracted light signal from the mark M as in the case of the earlier embodiment described above. If the central line of the spot is aligned with the central line CL of the mark M, the sum signal becomes a maximal value.

Figure 20B:
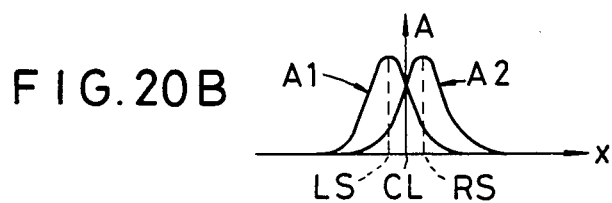
FIG. 20B is a waveform chart showing photoelectric signals.
Figure 21:
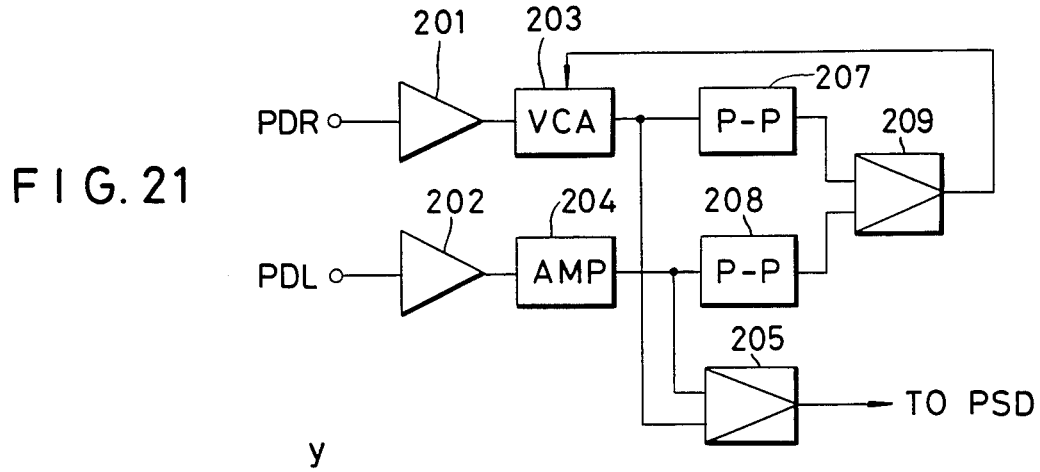
FIG. 21 is a block diagram of an automatic gain controller.

However, depending upon the wafer process, the light-reflection state of the mark M changes. Then, as shown in FIG. 20B, the photoelectric signal $A_1$ becomes maximal when the central line of the spot is aligned with the position LS which is shifted to the left from the central line CL of the mark M. The photoelectric signal $A_2$ becomes maximal when the central line of the spot is aligned with the position RS which is shifted to the right from the central line CL of the mark M. If the photoelectric signals $A_1$ and $A_2$ have the same amplitude, the maximal value of the sum signal is obtained at the position of the central line CL. However, if the photoelectric signals $A_1$ and $A_2$ have different amplitudes, the sum signal becomes maximal at a position which is shifted from the central line CL. Utilizing this fact, the gains of the amplifiers $AP_1$ and $AP_2$ are controlled so that the maximal values of the photoelectric signals $A_1$ and $A_2$ correspond to the central line CL. More specifically, the amplifiers $AP_1$ and $AP_2$ have an automatic gain control function with the circuit configuration as shown in FIG. 21. Preamplifiers 201 and 202 amplify the photoelectric signals from the photosensors PDR and PDL by the same gain. The amplified signal from the preamplifier 201 is supplied to a voltage-controlled amplifier (to be referred to as a VCA hereinafter) 203, and the amplified signal from the preamplifier 202 is supplied to an amplifier 204. Output signals from the VCA 203 and the amplifier 204 are added by an analog adder 205 and the sum signal from the adder 205 is supplied to a phase sync detector (to be referred to as a PSD hereinafter). Since the output signals from the VCA 203 and the amplifier 204 are AC signals, they are respectively supplied to peak-to-peak detectors (to be referred to as P—P detectors hereinafter) 207 and 208. Each P—P detector produces an analog voltage corresponding to the absolute value of the difference between the maximum and minimum values of the AC wave. A differehtial amplifier 209 supplies the voltage corresponding to the difference between the analog voltages to the VCA 203 as a control signal. Furthermore, the differential amplifier 209 produces a control signal (voltage) to control the gain of the VCA 203 so that the two analog voltages from the P—P detectors become equal to each other.

The processing circuit incorporating the automatic gain control function is applicable to detection of the marks FMX, FMY, SX, SY, GΘ and GY each comprising an array of short line segments as in the earlier embodiments. Therefore, the circuit shown in FIG. 21 can replace each of the amplifiers 120 and 124 shown in FIG. 7. In the case of each amplifier 131 or 134 shown in FIG. 9, the gain of one or both amplifiers 131 and 134 can be controlled in accordance with a control command from the CPU.

Figure 22:
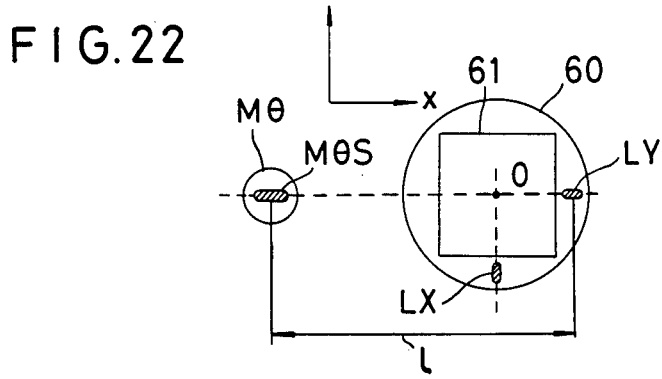
FIG. 22 is a plan view showing an arrangement of an alignment detection system according to another embodiment of the present invention.

Another embodiment of the present invention will now be described with reference to FIG. 22. In this embodiment, only the Θ alignment detection system of the off-axis system is used, and the Y alignment system function is obtained with the Y-LSA detection system of TTL system. FIG. 21 shows the arrangement of an effective exposure region 60 and a pattern exposure region 61, the spots LX and LY of the X-LSA and Y-LSA detection systems of TTL system, the first objective lens MΘ and the spot MΘS of the Θ alignment detection system. The Θ alignment system is arranged so that the spots LX and LY are formed to pass the exposure center O and on a line parallel to the x-axis to have an interval l. The interval l between the spots LY and MΘS along the x-axis is set to be equal to that between the marks GY₇ and GΘ₁₀ on the wafer. In order to complete the overall alignment of the wafer (global alignment), alignment along the y-axis and the rotational direction is performed by the spots LY and MΘS, and alignment along the x-axis is performed by the spot LX. In this embodiment, the first objective lens MΘ is arranged at the opposite side of the spot LY with respect to the exposure center O. However, this is to shorten the interval between the projection lens 6 and the Θ alignment detection system including the first objective lens MΘ, so that the overall apparatus can be rendered compact in size. In this case, the plane parallel 129 shown in FIG. 7 must be used to correctly align the spots MΘS and LY along the y-direction.

We claim:

1. In an apparatus for projecting an image of a pattern onto a substrate by a projection optical system, an apparatus for detecting a two-dimensional positional error between the image of the pattern and the substrate, comprising:
    first detecting means for detecting a positional error along an x-axis of an x-y orthogonal coordinate system arranged on an image surface of said projection optical system and having an origin on an optical axis of said projection optical system, said first detecting means including optical means for allowing observation of the image surface through said projection optical system; and
    second detecting means for detecting a positional error along a y-axis of the x-y coordinate system and a positional error along a rotating direction about the origin, said second detecting means including optical means for allowing observation of the image surface and arranged separately from said projection optical system.

2. An apparatus according to claim 1, wherein said first detecting means further includes means for generating a radiation beam for scanning the image surface through said projection optical system, and means for receiving said beam reflected by the image surface.

3. An apparatus according to claim 1, wherein said second detecting means further includes means for generating a radiation beam for scanning the image surface, objective lens means, arranged in the vicinity of said projection optical system, for focusing said beam on the image surface, and means for receiving said beam reflected by the image surface through said objective lens means.

4. An apparatus according to claim 3, wherein said objective lens means has first and second lens systems which are arranged at a predetermined distance from said projection optical system.

5. In an apparatus for projecting an image of a pattern onto a substrate by a projection optical system, an apparatus for detecting a two-dimensional positional error between the image of the pattern and the substrate, comprising:
    first detecting means for detecting a positional error along an x-axis of an x-y orthogonal coordinate system arranged on an image surface of said projection optical system and having an origin on an optical axis of said projection optical system and a positional error along a y-axis of the x-y coordinate system, said first detecting means including optical means for allowing observation of the image surface through said projection optical system; and
    second detecting means for detecting a positional error along a rotating direction about the origin, said second detecting means including optical means for allowing observation of the image surface and arranged separately from said projection optical system.

6. An apparatus according to claim 5, wherein said first detecting means further includes means for generating a radiation beam for scanning the image surface through said projection optical system, and means for receiving said beam reflected by the image surface.

7. An apparatus according to claim 5, wherein said second detecting means further includes means for generating a radiation beam for scanning the image surface, objective lens means, arranged in the vicinity of said projection optical system, for focusing said beam on the image surface, and means for receiving said beam reflected by the image surface through said objective lens means.

8. An apparatus according to claim 7, wherein said objective lens means has first and second lens systems which are arranged at a predetermined distance from said projection optical system.

9. An apparatus for detecting a position of an object, comprising:
    mark means arranged at a predetermined position on the object and having a plurality of short line segments arranged in a stripe pattern elongated linearly in a predetermined direction;
    means for providing on the object a radiation beam;
    scanning means for providing a two-dimensional relative displacement between the object and said beam;
    means for photoelectrically detecting diverged light from said mark means produced upon irradiation of said mark means with said beam;

said detecting means including at least a pair of converting means for receiving diverged beams emerging form the stripe pattern to opposite sides of said radiation beam and for generating corresponding electrical outputs, amplifying means respectively connected to said converting means, and means for controlling a gain of at least one of said amplifying means so that the amplified electrical outputs become equal to each other; and means responsive to said detecting means for determining the position of said object relative to said radiation beam on said object.

10. An apparatus according to claim 9, wherein said radiation beam is elongated in the same direction as said predetermined direction of said stripe pattern.

11. An apparatus according to claim 9, wherein said scanning means includes means for oscillating said radiation beam in a direction intersecting said predetermined direction, and each of said amplified electrical outputs is an alternating signal.

12. An apparatus according to claim 11, wherein said detecting means further includes means for adding said amplified electrical outputs of said amplifying means to generate an adding signal, and said determining means includes means for detecting a phase difference between an oscillation of said radiation beam and said adding signal.

13. In an apparatus for processing a substrate by an energy beam directed onto said substrate through an imaging optical system, an apparatus for detecting a two-dimensional positional error between said energy beam and said substrate, comprising:

first detecting means for detecting a positional error along an x-axis of an x-y orthogonal coordinate system arranged on an image surface of said imaging optical system and having an origin on an optical axis of said imaging optical system, said first detecting means including optical means for detecting an optical condition of the image surface through said imaging optical system; and second detecting means for detecting a positional error along a y-axis of the x-y coordinate system and a positional error along a rotating direction about the origin, said second detecting means including optical means for detecting the optical condition of the image surface and arranged separately from said imaging optical system.

14. An apparatus according to claim 13, wherein said first detecting means further includes means for generating a radiation beam for scanning the image surface through said imaging optical system, and means for receiving said radiation beam reflected by the image surface.

15. An apparatus according to claim 13, wherein said second detecting means further includes means for generating a radiation beam for scanning the image surface, objective lens means, arranged in the vicinity of said imaging optical system, for focusing said radiation beam on the image surface, and means for receiving said radiation beam reflected by the image surface through said objective lens means.

16. In an apparatus for processing a substrate by an energy beam directed onto said substrate through an imaging optical system, an apparatus for detecting a two-dimensional positional error between said energy beam and said substrate, comprising:

first detecting means for detecting a positional error along an x-axis of an x-y orthogonal coordinate system arranged on an image surface of said imaging optical system and having an origin on an optical axis of said imaging optical system and a positional error along a y-axis of the x-y coordinate system, said first detecting means including optical means for detecting an optical condition of the image surface through said imaging optical system; and second detecting means for detecting a positional error along a rotating direction about the origin, said second detecting means including optical means for detecting the optical condition of the image surface and arranged separately from said imaging optical system.

17. An apparatus according to claim 16, wherein said first detecting means further includes means for generating a radiation beam for scanning the image surface through said imaging optical system, and means for receiving said radiation beam reflected by the image surface.

18. An apparatus according to claim 16, wherein said second detecting means further includes means for generating a radiation beam for scanning the image surface, objective lens means, arranged in the vicinity of said imaging optical system, for focusing said radiation beam on the image surface, and means for receiving said radiation beam reflected by the image surface through said objective lens means.

* * * * *